(12) United States Patent
Lamb et al.

(10) Patent No.: US 8,441,925 B1
(45) Date of Patent: May 14, 2013

(54) PSEUDO-RELATIVE MODE WRED/TAIL DROP MECHANISM

(75) Inventors: Joe Lamb, Hopkington, MA (US); Benjamin Findlen, Shrewsbury, MA (US)

(73) Assignee: Juniper Networks, Inc., Sunnyvale, CA (US)

( * ) Notice: Subject to any disclaimer, the term of this patent is extended or adjusted under 35 U.S.C. 154(b) by 514 days.

(21) Appl. No.: 12/135,617

(22) Filed: Jun. 9, 2008

(51) Int. Cl.
*G01R 31/08* (2006.01)

(52) U.S. Cl.
USPC .......................................... 370/229; 370/235

(58) Field of Classification Search ............... 370/235, 370/230, 229
See application file for complete search history.

(56) References Cited

U.S. PATENT DOCUMENTS

| | | |
|---|---|---|
| 6,252,848 B1 | 6/2001 | Skirmont |
| 6,675,220 B1 | 1/2004 | Bergamasco et al. |
| 6,721,796 B1 | 4/2004 | Wong |
| 6,961,307 B1 | 11/2005 | Aweya et al. |
| 6,980,516 B1 | 12/2005 | Wibowo et al. |
| 7,369,500 B1 * | 5/2008 | Gallagher et al. ............ 370/235 |
| 2003/0016625 A1 * | 1/2003 | Narsinh et al. ................ 370/230 |

OTHER PUBLICATIONS

Haining Wang and Kang G. Shin, "Refined Design of Random Early Detection Gateways", Real-Time Computing Laboratory, Dept. of Electrical Engineering and Computer Science, University of Michigan.

Dong Lin and Robert Morris, "Dynamics of Random Early Detection", Division of Engineering and Applied Sciences, Harvard University.

Sally Floyd and Van Jacobson, "Random Early Detection Gateways for Congestion Avoidance", Lawrence Berkeley Laboratory, University of California, Aug. 1993.

B. Braden, D. Clark, J. Crowcroft, B. Davie, S Deering, D. Estrin, S. Floyd, V. Jacobson, G. Minshall, C. Partridge, L. Peterson, K. Ramakrishnan, S. Shenker, J. Wroclawski, L. Zhang, "Recommendations on Queue Management and Congestion Avoidance in the Internet", Networking Word Group, Apr. 1998.

Teunis J. Ott, T.V. Lakshman and Larry Wong, "SRED: Stabilized RED".

* cited by examiner

*Primary Examiner* — Thai Hoang
*Assistant Examiner* — Gbemileke Onamuti
(74) *Attorney, Agent, or Firm* — Harrity & Harrity, LLP (57) ABSTRACT

A buffer memory can be configured to temporarily store data in a number of queues. A processor can be configured to measure a fullness of the buffer memory. The processor can be configured to adjust thresholds and drop profiles based on a measured global resource usage for a weighted random early detection (WRED) technique with less resources than a conventional.

16 Claims, 8 Drawing Sheets

PSEUDO-RELATIVE MODE WRED/TAIL DROP MECHANISM

CROSS-REFERENCE TO RELATED APPLICATIONS

N/A

STATEMENTS REGARDING FEDERALLY SPONSORED RESEARCH OR DEVELOPMENT

N/A

REFERENCE TO A MICROFICHE APPENDIX

N/A

BACKGROUND OF THE INVENTION

1. Field of the Invention

The present invention relates generally to data communication and, more particularly, to systems and methods for performing weighted random early detection (WRED) in a data forwarding sub-system.

2. Description of Related Art

Network devices, such as routers, relay streams of data through a network from a source to a destination. Typically, the network devices include one or more memory subsystems to temporarily buffer data before transferring the data from the device. A network device can assign a number of queues (e.g., where a queue can be considered a logical first-in, first-out (FIFO) buffer) with which to buffer the data. In some instances, queues can be associated with characteristics of the data, such as destination interfaces (e.g., ports) of the data and/or a "class" of the data or some other combination of characteristics.

In some situations, data can build up too quickly in the queues (i.e., data is enqueued at a faster rate than it is dequeued), thereby causing congestion. To avoid forced "tail dropping" (i.e., dropping a chunk (e.g., a packet) of data from the tail of a queue, or before it is added to the queue), network devices can proactively employ a Random Early Detection (RED) technique to randomly drop chunks of data and ease congestion in the queues. RED techniques typically involve fixed-size queues in which fixed threshold values determine when chunks of data are randomly dropped and with what probabilities.

WRED generally drop packets selectively based on IP precedence. Packets with a higher IP precedence are less likely to be dropped than packets with a lower precedence. Thus, higher priority traffic is delivered with a higher probability than lower priority traffic.

Some network devices implement WRED techniques by defining WRED rules and implement RED techniques by defining RED rules. But in such systems, the hardware or software resources needed for WRED typically cause the system to provide fewer WRED rules than RED rules. Network devices also commonly monitor various types of global resource usage, such as the amount of a buffer memory used by the queues. This allows indexing or selecting WRED rules based on usage levels to achieve a more aggressive drop profile for usage levels.

BRIEF SUMMARY OF THE INVENTION

Systems and method consistent with the principles of the invention address this and other needs by providing congestion control techniques to efficiently process and buffer data in a network device. Pseudo-relative mode allows the use of multiple tail drop rules to achieve a more aggressive drop profile for higher resource usage levels. In some embodiments, a single WRED rule provides a minimum threshold and one of several Tail rules provides the maximum threshold, with the Tail rule and the threshold it provides varying as the usage changes. As the usage increases, the Tail rule provided maximum threshold will be a smaller value resulting in a more aggressive drop profile (steeper slope) as the minimum and maximum thresholds get closer. The result is a drop profile that uses one WRED rule, one drop curve, and multiple Tail rules to provide progressively more aggressive WRED dropping as higher levels of resources are in use. In other embodiments, no WRED rules are used; instead, a minimum threshold of zero is used, together with a drop profile constructed of at least two portions.

In one embodiment, a system for providing congestion control comprises: a buffer memory configured to store data temporarily in a queue; a processor; and a storage medium configured to store instructions that when executed by the processor, cause the processor to perform actions that comprise: measuring a queue fullness as an amount of the buffer memory occupied in the queue; measuring a global resource usage; selecting a maximum threshold of a plurality of maximum thresholds responsive to the measured global resource usage; selecting a minimum threshold of a plurality of minimum thresholds responsive to at least one characteristic of the data stored in the queue; and randomly dropping data from the queue if the queue fullness exceeds the selected minimum threshold and does not exceed the selected maximum threshold.

In another embodiment, a method of providing congestion control, comprises: periodically measuring a global resource usage; periodically measuring a queue fullness as an amount occupied of a queue; assigning a maximum queue fullness threshold responsive to the measured global resource usage; assigning a minimum queue fullness threshold responsive to at least one characteristic of the data stored in the queue; and randomly dropping data from the queue if the queue fullness exceeds the minimum queue fullness threshold and does not exceed the maximum queue fullness threshold.

In another embodiment, a method of providing congestion control, comprises: periodically measuring a global resource usage; periodically measuring a queue fullness as an amount occupied of a queue; assigning a maximum queue fullness threshold responsive to the measured global resource usage; and randomly dropping data from the queue if the queue fullness exceeds the minimum queue fullness threshold and does not exceed the maximum queue fullness threshold.

BRIEF DESCRIPTION OF THE SEVERAL VIEWS OF THE DRAWINGS

The accompanying drawings, which are incorporated in and constitute a part of this specification, illustrate an implementation of apparatus and methods consistent with the present invention and, together with the detailed description, serve to explain advantages and principles consistent with the invention. In the drawings.

DETAILED DESCRIPTION OF THE INVENTION

The following detailed description of the invention refers to the accompanying drawings. Also, the following detailed description does not limit the invention. Instead, the scope of the invention is defined by the appended claims and equivalents of the recited claim limitations. Unless expressly indicated otherwise herein, the term "or" means any combination of all or any of the items listed, and the term "including," when used to begin a list of items means that the list is not exclusive.

The systems and methods disclosed below provide congestion control techniques to efficiently process and buffer chunks of data.

Figure 1:
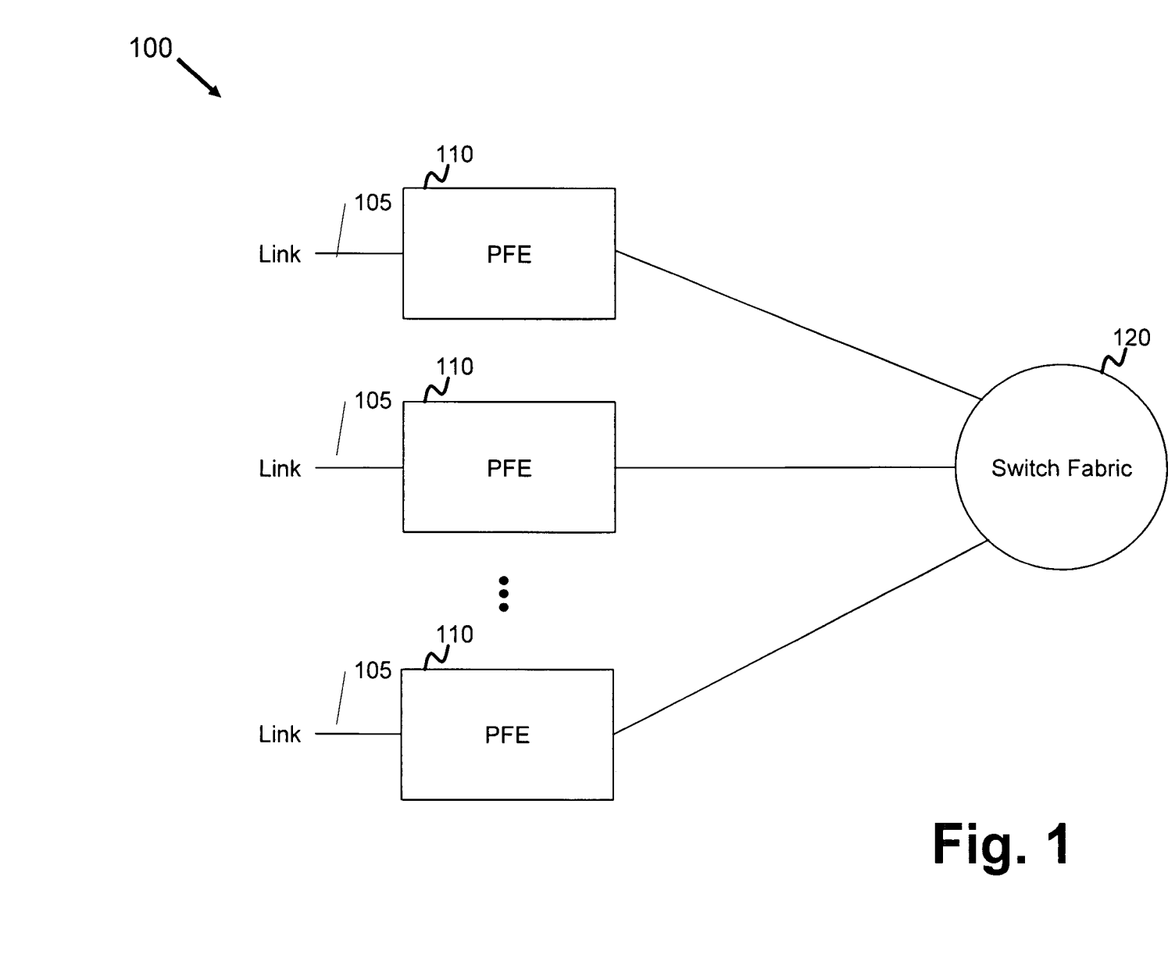
FIG. 1 is a diagram of an exemplary network device of one embodiment.

FIG. 1 is a diagram of an exemplary network device in which systems and methods consistent with the principles of the invention can be implemented. In this particular implementation, the network device takes the form of a router 100. Router 100 can receive one or more streams of data chunks from a physical link, process the stream(s) to determine destination information, and transmit the stream(s) on one or more links in accordance with the destination information.

Router 100 can include multiple packet forwarding engines (PFEs) 110 interconnected via a switch fabric 120. Switch fabric 120 can include one or more switching planes to facilitate communication between two or more of PFEs 110. In various embodiments, each of the switching planes includes a single or multi-stage switch of crossbar elements. Coordination among PFEs 110 can be accomplished by PFEs 110 themselves, by a system processor (not shown) that can be connected to PFEs 110, or a combination of these.

PFEs 110 can include forwarding tables to perform route lookup for incoming chunks of data (e.g., packets). PFEs 110 can receive data at ports on physical links 105 connected to a network, such as a wide area network (WAN), a local area network (LAN), or another network device. Each physical link 105 can be one of many types of transport media, such as optical fiber or Ethernet cable. The data on the physical link is formatted according to one of several protocols, such as the synchronous optical network (SONET) standard or Ethernet.

Figure 2:
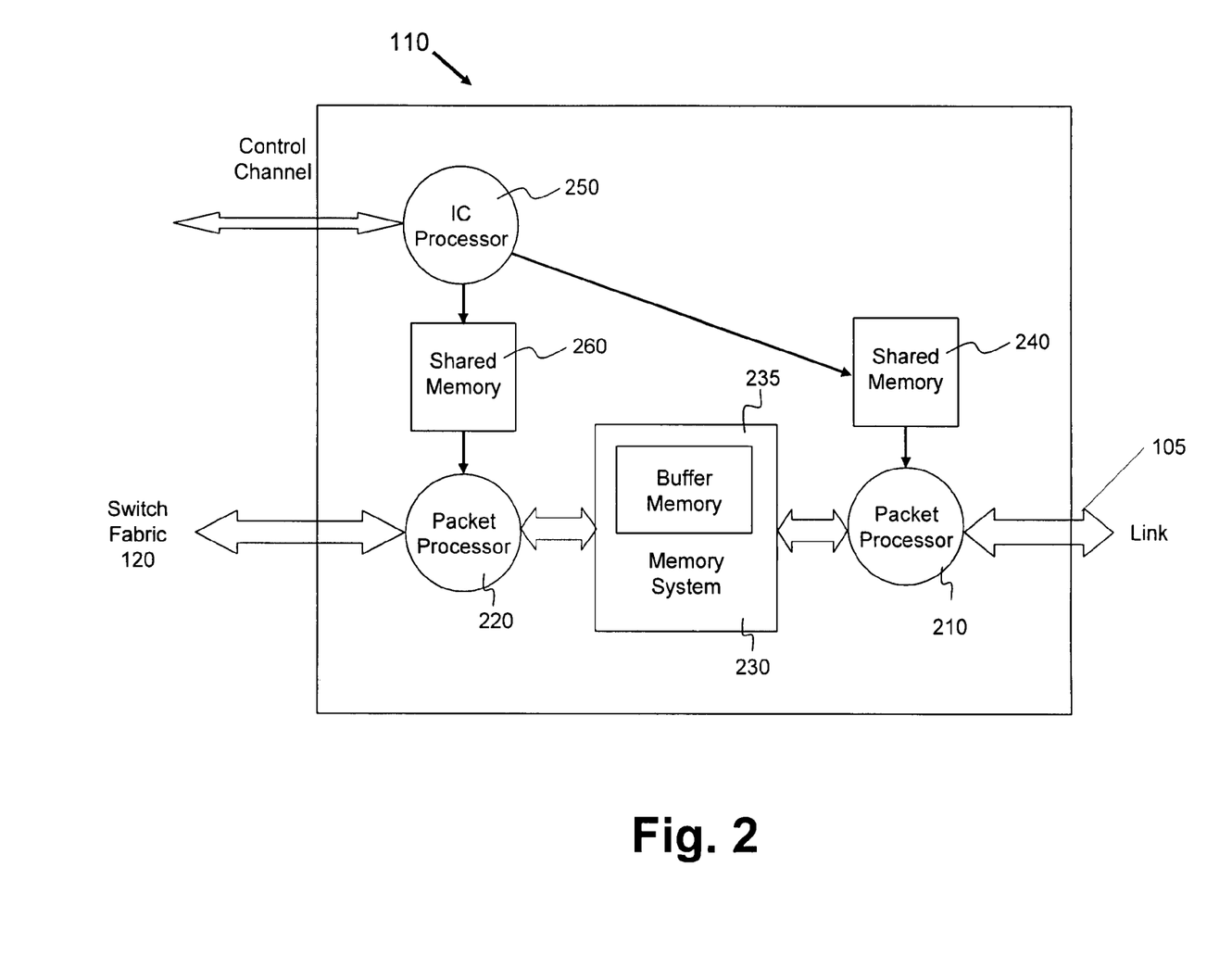
FIG. 2 is an exemplary diagram of a packet forwarding engine (PFE) of FIG. 1 according to one embodiment.

FIG. 2 is an exemplary diagram of a PFE 110 according to some embodiments. PFE 110 can include two packet processors 210 and 220, each connected to a memory system 230. PFE 110 also can include an interface controller (IC) processor 250 connected to shared memories 240 and 260, which are connected to packet processors 210 and 220, respectively. Packet processors 210 and 220 typically read routing-related information from their respective shared memories 240 and 260.

Packet processor 210 connects to one or more physical links 105. Packet processor 210 can process packets received from the incoming physical links 105 and prepare packets for transmission on the outgoing physical links 105. For example, packet processor 210 can perform route lookup based on packet header information in conjunction with information from shared memory 240 to determine destination information for the packets. Packet processor 210 also can designate a "class" of data to which a particular chunk (e.g., packet) belongs based on one or more characteristics of the data. For example, chunks of data within a certain bandwidth can be designated as high priority, while chunks that exceed this bandwidth can be given a lower priority. For packets received from the links 105, packet processor 210 can store data in memory system 230. For packets to be transmitted on the links 105, packet processor 210 can read data from memory system 230.

Packet processor 210 can include one or more circuits, such as application-specific integrated circuits (ASICs), local memory, physical interface(s) and any other parts needed to interface between the physical links 105 and memory system 230. In one embodiment, packet processor 210 can include a device (not shown) that measures an amount of memory system 230 or buffer memory 235 that is full, known as a "usage meter" or "usemeter"). Packet processor 210 can also perform a WRED function for PFE 110 that will be described in greater detail below.

Packet processor 220 connects to switch fabric 120. Packet processor 220 can include one or more circuits, such as ASICs, local memory, and any other parts needed to interface between the switch fabric 120 and memory system 230. Packet processor 220 can process packets received from switch fabric 120 and prepare packets for transmission to switch fabric 120. For packets received from switch fabric 120, packet processor 220 can store data in memory system 230. For example, such packets from switch fabric 120 can be stored in logical queues within memory system 230. For packets to be transmitted to switch fabric 120, packet processor 220 can read data from memory system 230. Although described as including different ASICs, in some embodiments, the functionality of packet processors 210 and 220 described herein can be performed by the same processor or ASIC or set of processors or ASICs. Thus, the arrangement shown in FIG. 2 conceptually illustrates the functionality of PFE 110 and does not necessarily reflect any particular, physical implementation of PFE 110.

Memory system 230 can include a buffer memory 235 for storing chunks of data from switch fabric 120 prior to transmitting them on physical links 105 according to some embodiments. Buffer memory 235 can store the chunks of data in logical queues, possibly occupying non-contiguous locations. Packet processor 220 can store the chunks of data in such queues based on, for example, an interface (e.g., a packet stream or port within an external link) to which the packet information corresponds. Other information, such as a traffic class to which the packet belongs, can be used in determining the particular queue or queues in which to store the packet information.

Figure 3:
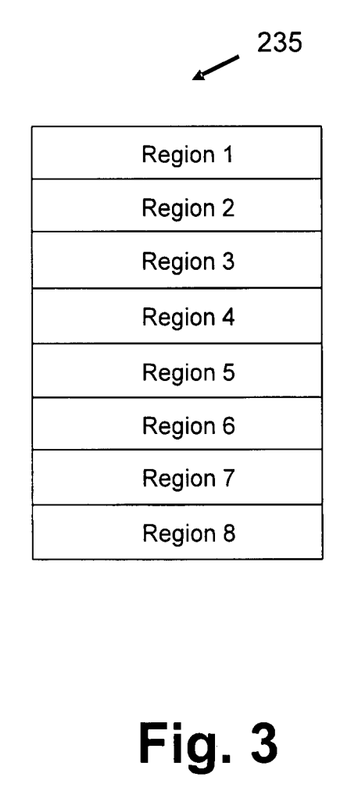
FIG. 3 is an exemplary fullness diagram of a portion of the memory of FIG. 2 according to one embodiment.

FIG. 3 is an exemplary fullness diagram for buffer memory 235 according to one embodiment. Buffer memory 235 can be implemented by a DRAM or SRAM device or any other desirable storage media. As mentioned above, the "fullness" of buffer memory 235 can be determined by a usage meter (not shown) in packet processor 210. Such a usage meter can determine an overall level of utilization of buffer memory 235 relative to a total capacity of buffer memory 235. Such "fullness" of buffer memory can be expressed with varying degrees of precision depending on the needs of PFE 110. For example, the fullness of buffer memory 235 can be measured to within a few percent of its total capacity, and such measurement can be produced by hardware or software in packet processor 210 as a percentage value, an unprocessed "raw" measurement value, or in any other desired form.

One possible technique for determining the fullness of buffer memory 235 is to map or "bin" a more precise measurement by packet processor 210 into one of a number of coarser fullness values. FIG. 3 conceptually illustrates an eight-level fullness scale for buffer memory 235. For example, if buffer memory 235 is between 0 and one-eighth full (as measured by packet processor 210), its utilization falls in Region 1 on the scale in FIG. 3. Similarly, if buffer memory 235 is between one-eighth and one-quarter full, its utilization falls in Region 2, and so on to Region 8, which indicates near-fullness of buffer memory 235. It should be noted that data in queues within buffer memory 235 need not be contiguous, nor beginning at a lowest/highest logical address within the memory, so Regions 1-8 in FIG. 3 do not necessarily correspond to the location(s) of usage within buffer memory 235. Rather, Regions 1-8 in FIG. 3 illustrate a coarse, eight-level fullness scale for buffer memory 235 that can be used to measure buffer memory 23 occupancy or fullness. A usemeter for buffer memory 235 can be implemented by storing a value of 0-8 in a register or any other suitable technique known to the art.

Returning to FIG. 2, IC processor 250 and shared memories 240 and 260 can be configured to assist the operation of packet processors 210 and 220. IC processor 250 can receive parameters for such assistance via a control channel. IC processor 250 can be configured to format and process such parameters, prior to storage in shared memory 240. Such formatting or processing can optimize the parameters for rapid retrieval from shared memory 240 or rapid use by packet processor 210.

Queues in buffer memory 235 can include a set of first-in-first-out (FIFO) logical buffers that temporarily store chunks of data that are to be transmitted from PFE 110 on one or more physical links. In one embodiment, the queues in buffer memory 235 can be associated with a particular traffic class-interface pair. For example, if PFE 110 is associated with 4,000 IP interfaces, each of which can include four traffic classes, then 16,000 queues can be created in buffer memory 235. A larger or smaller number of different queues can be created in buffer memory 235, depending on the number of destination interfaces and traffic classes. Further, different schemes of creating queues are possible, such as creating queues based only on the number of interfaces. In such a case, a particular queue can contain chunks of data belonging to different traffic classes. Moreover, queues can be created for protocols other than IP, such as the Point-to-point Protocol (PPP), or MPLS, or other suitable protocols. Queues can also be created based on interface or sub-interface types such as, for example, Ethernet VLANs, ATM VCs, ATM VPs, and Frame relay DLCIs.

Figure 4:
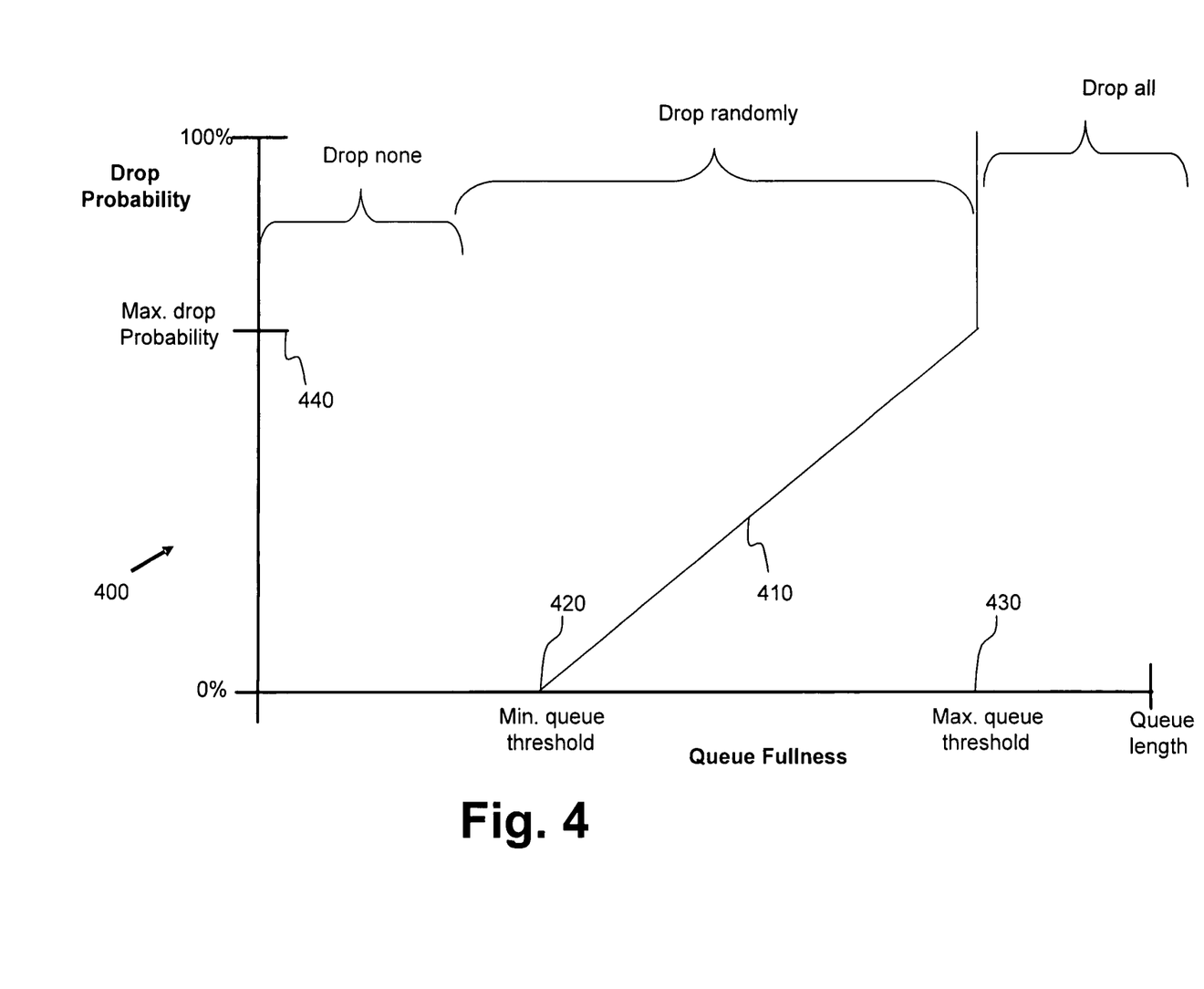
FIG. 4 is an exemplary RED drop profile.

FIG. 4 illustrates an exemplary WRED drop plot 400. Plot 400 contrasts the probability that a chunk of data will be randomly dropped from a queue with some measure of the occupancy or fullness of the queue (e.g., average queue length). Drop profile 410 specifies chunk dropping behavior due to RED for one or more queues. As shown in FIG. 4, drop profile 410 can be uniquely determined using three parameters: 1) a minimum queue threshold 420, 2) a maximum queue threshold 430, and 3) a maximum drop probability 440.

Minimum queue threshold 420 can represent a measure of queue fullness (e.g., average queue length) below which no chunks of data are dropped from the queue in buffer memory 235. When minimum queue threshold 420 is exceeded for a queue, chunks of data can be randomly dropped or tail-dropped, depending on how much the fullness of the queue exceeds minimum queue threshold 420. When minimum queue threshold 420 is not exceeded for a queue, however, the queue fills and empties normally.

Maximum queue threshold 430 can represent a measure of queue fullness (e.g., average queue length) above which all new chunks of data are tail-dropped from the queue in question. In some implementations, maximum queue threshold 430 can be less than the total length of the queue. When maximum queue threshold 430 is exceeded for a queue, no new chunks of data are added to the queue (i.e., 100% are dropped from the tail) to allow the queue to drain as fast as possible. When queue fullness (e.g., average queue length) lies between minimum queue threshold 420 and maximum queue threshold 430, packet processor 210 can randomly drop some percentage of new chunks from the tail of the queue(s).

In drop profile 510 shown in FIG. 4, the percentage of chunks of data that are randomly dropped from a queue can vary roughly linearly from zero to maximum drop probability 440 as the queue fullness (e.g., average queue length) ranges from minimum queue threshold 420 to maximum queue threshold 430. Although maximum drop probability 440 is illustrated in FIG. 4 as being somewhat closer to 100% than 0% (for example, 80%), it should be noted that maximum drop probability 440 can lie anywhere in this range and can only be, for example, 5% or 10%. Further, consistent with the principles of the invention, other ways than linearly can be used to define a drop profile 410 to vary drop probability between minimum queue threshold 420 and maximum queue threshold 430. For example, step functions, polynomial, logarithmic, and/or other increasing functions can be employed to vary drop probability between 0% and maximum drop probability 440. Moreover, in some embodiments the drop probability of drop profile 510 can have some non-zero initial value at minimum queue threshold 420.

Although the lower axis in FIG. 4 is labeled "queue fullness," a weighted fullness average (i.e., average queue length) can be employed in some embodiments to reduce sensitivity to sudden increases or decreases in queue fullness. One example of such an average fullness can be seen in the following exponential weighted moving average:

$$averageFullness = averageFullness + 2^{-aveExp(currentFullness-averageFullness)}$$

where the value of aveExp can be chosen based on the speed of the link associated with the queue in question. As an example, for an OC3 link, aveExp can be set to be about 10.

Figure 5:
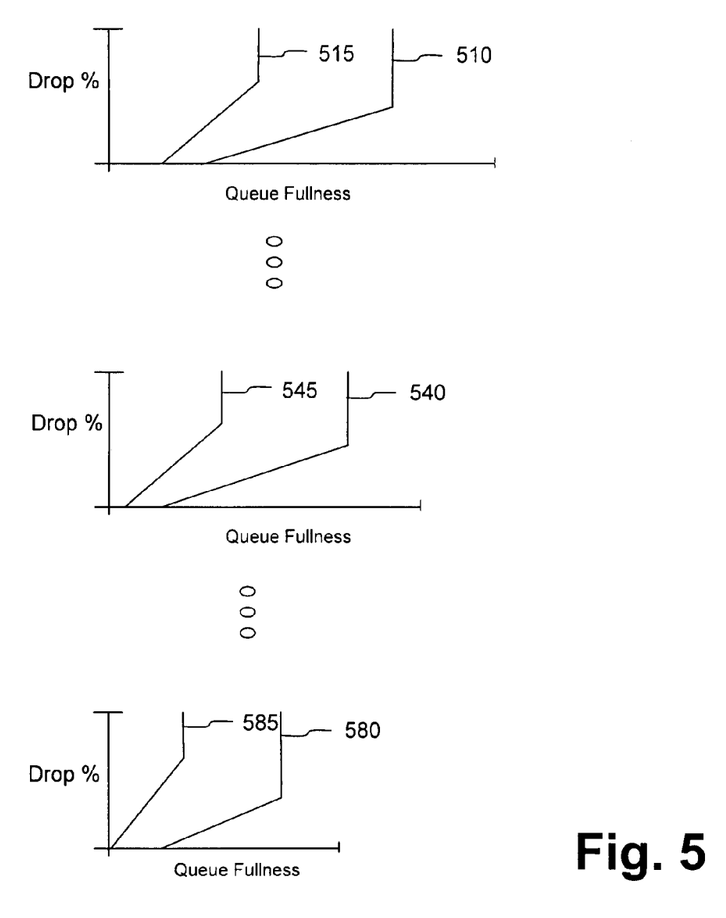
FIG. 5 is an exemplary diagram illustrating dynamic RED drop profiles that vary by type of data according to one embodiment.

FIG. 5 is an exemplary diagram illustrating dynamic WRED drop profiles 510-580 and 515-585 that vary by type of data according to some embodiments. In one embodiment, drop profiles 510-580 can be associated with a group of queues containing a type or class of data that has a relatively high priority, and drop profiles 515-585 can be associated with a group of queues containing a type or class of data that has a relatively low priority. Type or class of data are exemplary and illustrative characteristics only and any characteristic of the data can be used. Alternately or additionally, WRED drop profiles 510-580 and 515-585 can be associated with the same queue (or group of queues) that contains data of both classes. In some embodiments, greater than two data types or classes are possible for chunks of data within PFE 110 and buffer memory 235. Such data classes can include, but are not limited to, video data, multicast data, internet data, or a default classification (e.g., best effort).

Exemplary values for profiles 510-580 for high priority chunks of data can use a minimum queue threshold of 20% of the total queue length, a maximum queue threshold of 80% of the total queue length, and a maximum drop probability is 5%. By contrast, exemplary values for profiles 515-585 for lower priority chunks can cause packet processor 210 to begin to randomly drop chunks of data associated with profiles 515-585 earlier (i.e., at 10% of the total queue length) than chunks of data associated with drop profiles 510-580. Such lower priority chunks associated with profiles 515-585 can also be randomly dropped up to a lower maximum threshold (i.e., 40% of the total queue length) and can have a higher maximum drop probability (i.e., 10%) than chunks of data associated with profiles 510-580. The above numerical examples for profiles 510-580 and 515-585 in FIG. 5 are purely exemplary and illustrative, and other profiles can be used.

Figure 6:
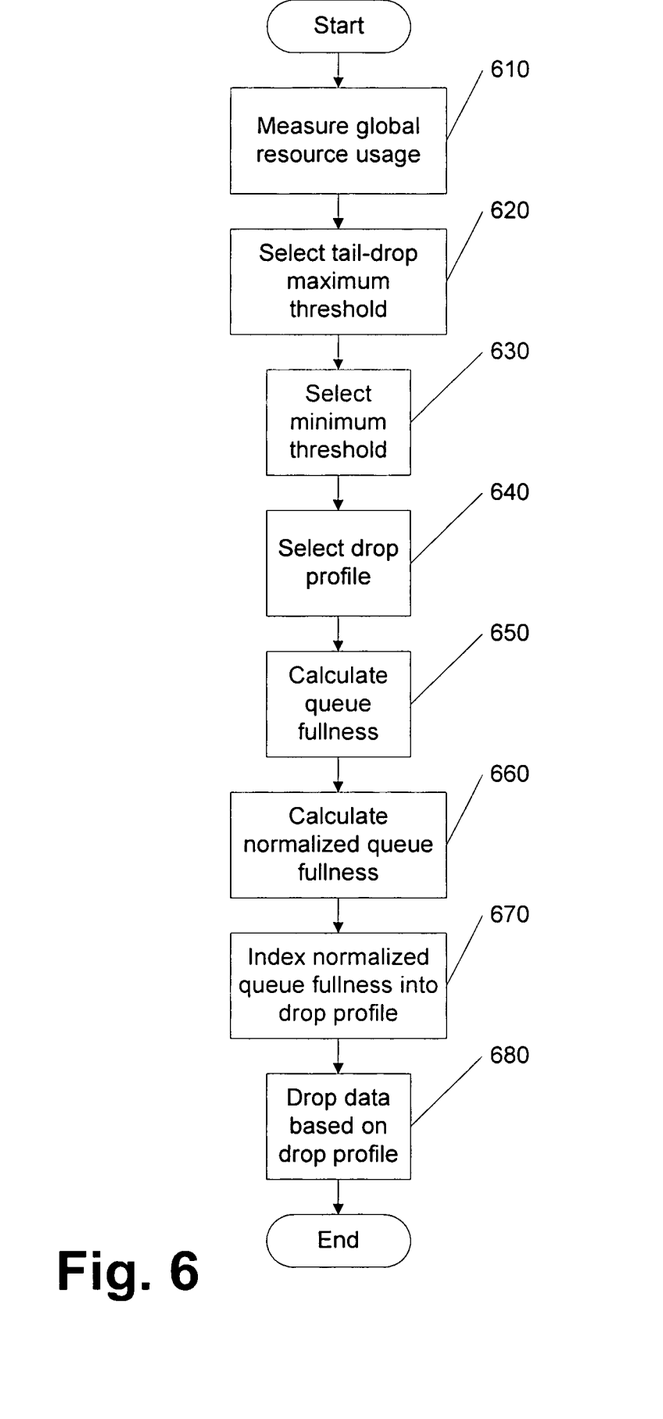
FIG. 6 is an exemplary flow chart illustrating processing according to one embodiment.

FIG. 6 is an exemplary flow chart 600 illustrating one embodiment. In block 660, a usemeter of packet processor 210 measures or calculates a global resource usage, such as the amount of buffer memory 235 in use. As described above, the usemeter can be implemented in hardware or software. Any desirable global resource can be measured in block 610.

In block 620, packet processor 210 selects a maximum threshold for use in the pseudo-relative WRED/Tail drop mechanism. In one embodiment, the maximum threshold is selected from a plurality of tail rules maintained by packet processor 210. In block 630, packet processor 210 selects a minimum threshold. In one embodiment, the minimum threshold is selected from a plurality of WRED rules maintained by the packet processor 210. In another embodiment, the minimum threshold is selected as a zero threshold.

The tail and WRED rules may be stored in shared memory 240 or in any other convenient storage mechanism.

The selection of the maximum threshold in block 620 is based on the measured global resource usage calculated in block 610. Typically, a lower maximum threshold is selected responsive to a lower global resource usage. The selection of a WRED rule in block 630 is typically based on a characteristic of the data in the queue. For example, a queue containing low priority data would typically cause the selection of a lower minimum threshold or WRED rule, and a queue with a relatively high priority would typically cause the selection of a higher minimum threshold or WRED rule.

In block 640, a drop profile is selected. In some embodiments, a single drop profile is used regardless of the selected minimum and maximum thresholds. In other embodiments, a drop profile is selected associated with the WRED rule used for the selected minimum threshold. Other techniques for selecting a drop profile can be used.

In block 650, the current queue fullness or occupancy is calculated. In some embodiments, this is the instantaneous queue length. In more preferred embodiments, weighted average queue fullness is used to reduce sensitivity to sudden changes in queue fullness, as explained above.

In some embodiments, the drop profile is implemented as a series of drop probability values stored in a range of memory locations. In those embodiments, the queue fullness value can be used to index into the drop profile if the queue fullness is normalized to one of a range of index values, such as being normalized to a 0-255 value, in block 660. Then in block 670, the normalized fullness value is used to index into the drop profile and determine a corresponding drop probability.

In block 680 packet processor 210 can drop data from the queue based on the drop probability obtained from the drop profile. If the queue fullness does not exceed the minimum threshold selected in block 630, then no chunks of data are dropped. If the queue fullness lies between the minimum and maximum threshold, packet processor 210 randomly drops chunks of data from the queues with a probability of the drop probability obtained from the drop profile. And if the queue fullness exceeds the maximum queue threshold, packet processor 210 tail drops all new chunks from the queue until the queue fullness is below the maximum threshold. This tail dropping can continue until packet processor 210 again performs block 610 to measure the global resource usage measured by the block, at which point blocks 620 through 680 are performed again, based on the updated measured global resource usage.

Figure 7:
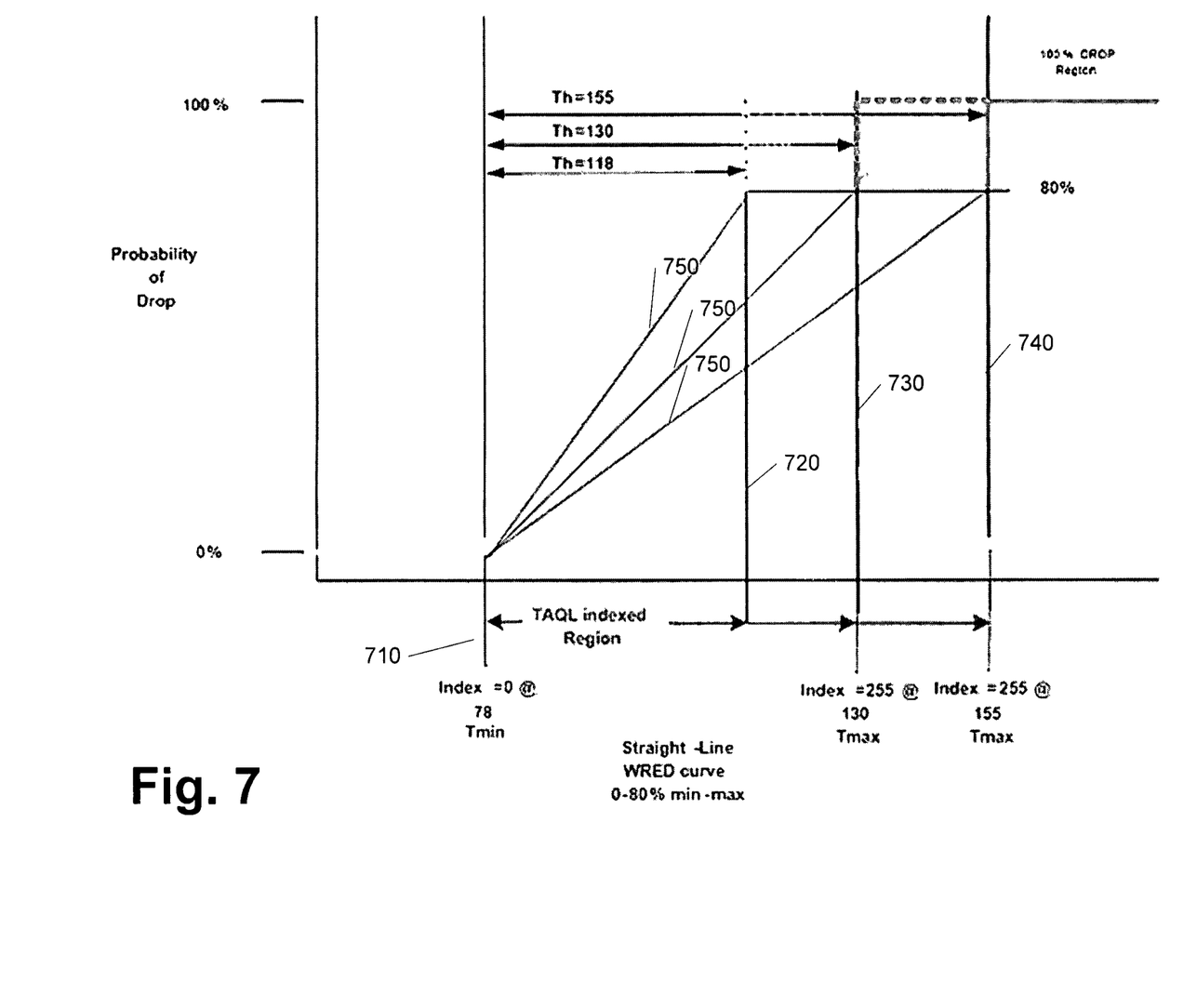
FIGS. 7 and 8 are exemplary diagrams illustrating embodiments of the technique of FIG. 6.
Figure 8:
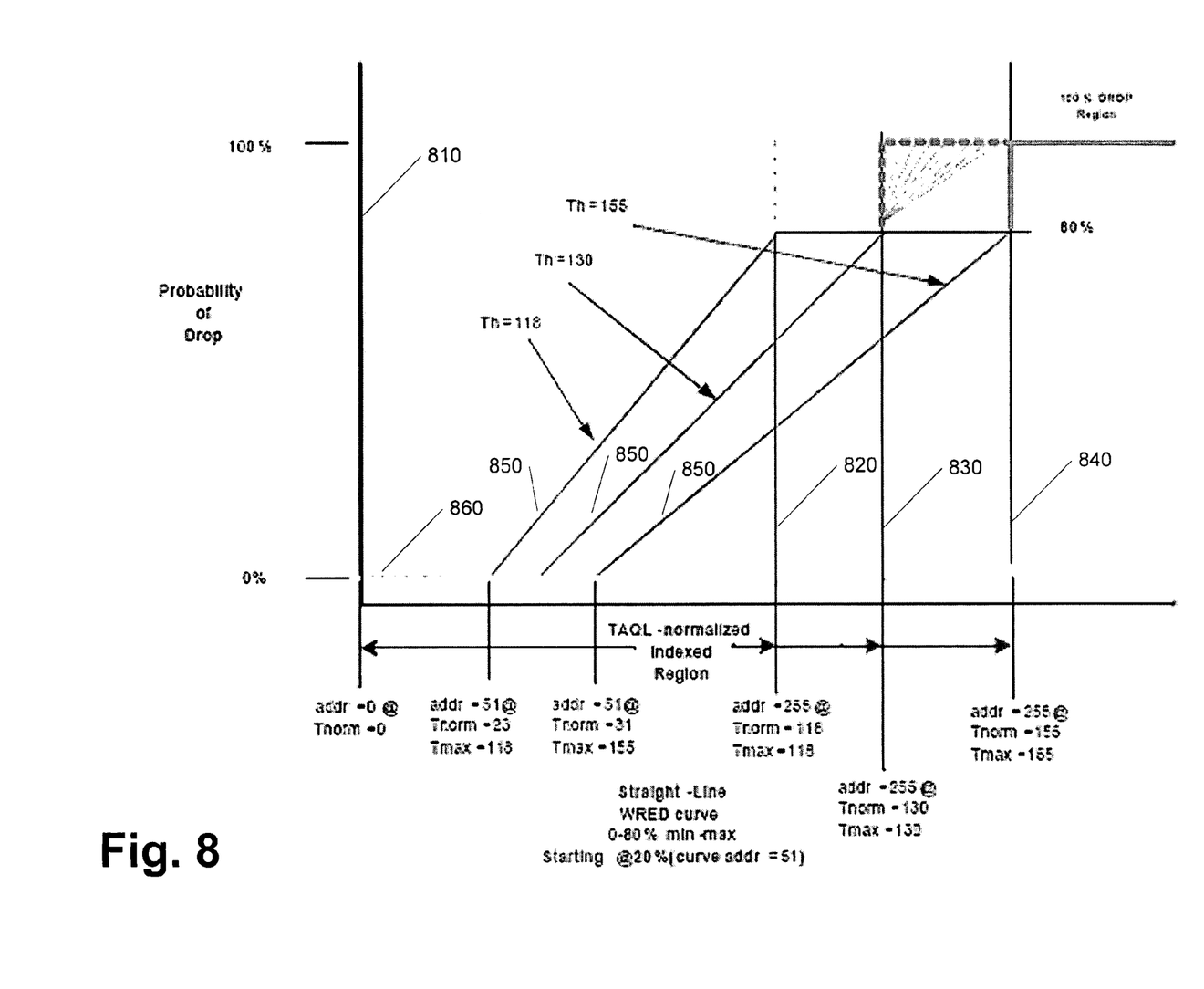

FIGS. 7 and 8 illustrate two embodiments of the technique described above. In FIG. 7, a WRED rule defines an exemplary minimum threshold of 78. Three exemplary maximum thresholds 720, 730, and 740 are defined as 118, 130, and 155, respectively. A WRED straight-line drop profile 750 is stored as a 255 element region of memory, and the average queue occupancy or fullness, and this example calculated as a Total Average Queue Length (TAQL) is normalized to a 0-255 value to index into the drop profile. At the minimum threshold 710, the drop probability of the drop profile is 0%. At the normalized TAQL value of 255, corresponding to maximum thresholds 720, 730, and 740, the drop probability is 80%, with a 100% drop region above the maximum thresholds 720, 730, and 740. As can be seen in FIG. 7, the slope of the drop profile 750 increases if a lower maximum threshold 720 is selected compared to a higher maximum threshold 940.

FIG. 8 is a chart illustrating another embodiment. In this embodiment, a minimum threshold of zero is always selected. As with FIG. 7, the drop profile is defined as a 0-255 look-up region indexed by a normalized queue fullness value. But instead of a linear drop profile as in FIG. 7, a WRED drop profile is created with two portions. The first portion 860 is defined to have a zero drop probability and is defined to extend from a normalized queue fullness of zero for a predetermined fractional distance from zero. In FIG. 8, the first portion is the lower 20% of the drop profile, which means normalized values of 0-51 would result in a drop probability of zero. This corresponds to a zero probability for fullness values of zero to approximately 23 when the maximum threshold 820 of 118 is selected, and from zero to approximately 31 when maximum threshold 840 of 130 is selected. The second portion 850 of the drop profile presents a variable range of drop probabilities from zero to 80%, with a slope that varies depending on the maximum threshold 820, 830, or 840 that is selected.

The ranges of values, drop profiles, minimum and maximum threshold values, and normalization ranges shown in FIGS. 7 and 8 are exemplary and illustrative only, and variations of those elements can be used.

The foregoing description of preferred embodiments of the present invention provides illustration and description, but is not intended to be exhaustive or to limit the invention to the precise form disclosed. Modifications and variations are possible in light of the above teachings or can be acquired from practice of the invention.

Also, while some memory elements have been described as RAMs, other types of memory devices can be used in other implementations consistent with the principles of the invention.

Certain portions of the invention have been described as "logic" or a "processor" that performs one or more functions. This logic/processor can include hardware, such as an application specific integrated circuit or a field programmable gate array, software, or a combination of hardware and software.

Also, while a series of blocks have been described with regard to certain Figs., the order of the blocks can be varied in other embodiments, and non-dependent blocks can be implemented in parallel.

No element, act, or instruction used in the description of the present application should be construed as critical or essential to the invention unless explicitly described as such. The scope of the invention is defined by the claims and their equivalents.

We claim:

1. A network device comprising:
   a memory that includes at least a first queue, the memory to store data transmitted via the network device; and
   a processor to:
      determine a current usage level of the memory,
      select, based on a characteristic of data stored in the first queue, a drop profile associated with a range of memory locations, of the memory,
         where each of the memory locations is associated with one of a plurality of random early detection (RED) rules, and
         where the drop profile comprises:
            a first portion that is associated with a first range of normalized queue fullness values and includes a first plurality of memory locations, of the range of memory locations, and
            a second portion that is associated with a second range of normalized queue fullness values and includes a second plurality of memory locations, of the range of memory locations,
      calculate a normalized weighted average queue fullness value associated with the first queue,
      determine, based on the drop profile, whether the normalized weighted average queue fullness value is included in the first range of normalized queue fullness values or the second range of normalized queue fullness values,
   where, when the normalized weighted average queue fullness value is included in the first range of normalized queue fullness values, the processor is to:
      determine that a drop probability associated with the first queue comprises a zero drop probability, and
      allow data to enter the first queue without dropping any of the data, based on the drop probability comprising the zero drop probability,
   where, when the normalized weighted average queue fullness value is included in the second range of normalized queue fullness values, the processor is to:
      identify one of the plurality of random early detection (RED) rules based on the normalized weighted average queue fullness value and the range of memory locations, of the drop profile,
      determine, based on the identified one of the plurality of RED rules, a maximum threshold associated with the first queue,
         where a rate of change of a drop probability associated with the second range of normalized queue fullness values is based on a slope, associated with the second range of normalized queue fullness values, that varies based on the maximum threshold, and
      randomly drop data from the first queue, based on a drop probability obtained from the drop profile when the normalized weighted average queue fullness exceeds the minimum threshold and does not exceed the maximum threshold.

2. The network device of claim 1, where the processor is further to:
   tail drop data from the first queue when the normalized weighted average queue fullness value is included in the second range of normalized queue fullness values and the normalized weighted average queue fullness exceeds the maximum threshold.

3. The network device of claim 1, where the drop profile is stored as a series of values in the range of memory locations.

4. The network device of claim 3, where the slope is a non-linear function of queue occupancy.

5. The network device of claim 3, where the slope is a linear function of queue occupancy.

6. The network device of claim 1, where the first range of normalized queue fullness values is associated with a minimum threshold value that corresponds to the first queue comprising an empty queue.

7. The network device of claim 6, where the slope comprises a function of a queue occupancy of the first queue.

8. A method of providing congestion control for data stored in one or more queues associated with a network device, the method comprising:
   determining, by the network device, a global resource usage level of the one or more queues;
   determining, by the network device, a weighted average queue fullness of a first queue, of the one or more queues;
   selecting, by the network device, a weighted random early detection (WRED) rule, of a plurality of WRED rules, based on a type of data stored in the first queue;
   calculating, by the network device, a minimum queue fullness threshold, of the first queue, responsive to the determined global resource usage level and based on the WRED rule;
   selecting, by the network device and based on the selected WRED rule, a drop profile, where the drop profile is implemented as a series of values stored in a range of memory locations, where each value, of the series of values, is associated with a corresponding one of a plurality of random early detection (RED) rules;
   normalizing, by the network device, the weighted average queue fullness to one of the series of values based on a quantity of memory locations, of the range of memory locations storing the series of values;
   identifying, by the network device, one of the series of values, based on normalizing the weighted average queue fullness;
   identifying, by the network device, a drop probability corresponding to the identified series of values based on the drop profile;
   identifying, by the network device and based on the identified one of the series of values, one of the plurality of RED rules;
   determining, by the network device and based on the identified one of the plurality of RED rules, a maximum queue fullness threshold associated with the first queue; and
   randomly dropping data from the first queue based on the drop probability when the weighted average queue fullness exceeds the minimum queue fullness threshold and does not exceed the maximum queue fullness threshold.

9. The method of claim 8, where the drop profile comprises a linear function of queue occupancy.

10. The method of claim 8, where the maximum queue fullness threshold and the minimum queue fullness threshold are defined as a fractional amount of a length of the first queue.

11. A method of providing congestion control for data stored in one or more queues of a network device, the method comprising:
    determining, by the network device, a weighted average queue fullness as an amount occupied of a first queue, of the one or more queues;

selecting, by the network device, a drop profile associated with a single weighted random early detection (WRED) rule and a plurality of random early detection (RED) rules;
determining, by the network device, a minimum queue fullness threshold based on the drop profile,
where the WRED is associated with the first queue based on a characteristic of data stored in the first queue;
implementing the drop profile as a series of values stored in a range of memory locations, each value, of the series of values, being associated with a corresponding one of the plurality of RED rules;
normalizing, by the network device, the weighted average queue fullness to determine a normalized weighted average queue fullness value based on a quantity of memory locations included in the range of memory locations;
identifying, by the network device, one of the series of values based on the normalized weighted average queue fullness value;
identifying, by the network device and based on the identified one of the series of values, the corresponding one of the plurality of RED rules associated with the identified one of the series of values;
calculating, by the network device, a maximum queue fullness threshold based on the identified one of the plurality of RED rules;
identifying, by the network device, a drop percentage associated with dropping data from the first queue when the weighted average queue fullness exceeds the minimum queue fullness threshold and does not exceed the maximum queue fullness threshold, based on the normalized weighted average queue fullness value and a slope associated with the series of values and the maximum queue fullness threshold; and
randomly dropping, by the network device, data from the first queue based on the drop percentage when the weighted average queue fullness exceeds the minimum queue fullness threshold and does not exceed the maximum queue fullness threshold.

12. The method of claim 11, further comprising:
dropping, based on the drop profile, data from the first queue when the weighted average queue fullness exceeds the maximum queue fullness threshold; and
not dropping, based on the drop profile, data from the first queue when the weighted average queue fullness does not exceed the minimum queue fullness threshold.

13. The method of claim 12, further comprising:
assigning a first drop probability to a first portion of the series of values, where the first portion comprises a first plurality of values, of the series of values; and
assigning a second drop probability to each value of a second portion of the series of values, where the second portion comprises a second plurality of values, of the series of values, that is different from the first plurality of values, and
where the second drop probability is assigned to each value of the second portion as a function of queue occupancy of the first queue.

14. The method of claim 13, where the first drop probability is zero, and
where determining the minimum queue threshold value includes:
determining whether the first portion of the series of values includes the identified one of the series of values, and
determining not to drop any data from the first queue based on the first drop probability when the first portion of the series of values includes the identified one of the series of values.

15. The method of claim 13, where the function of queue occupancy produces a maximum value less than one.

16. The method of claim 12, where the slope comprises a non-linear function of queue occupancy of the first queue.

* * * * *

UNITED STATES PATENT AND TRADEMARK OFFICE
CERTIFICATE OF CORRECTION

PATENT NO. : 8,441,925 B1
APPLICATION NO. : 12/135617
DATED : May 14, 2013
INVENTOR(S) : Joe Lamb et al.

Page 1 of 1

It is certified that error appears in the above-identified patent and that said Letters Patent is hereby corrected as shown below:

In the Claims:

Column 9, claim 1, line 57 following "exceeds" replace "the" with "a";

Column 11, claim 11, line 27 following "percentage" insert --,--.

Signed and Sealed this
Sixteenth Day of July, 2013

Teresa Stanek Rea
*Acting Director of the United States Patent and Trademark Office*